United States Patent
Oh et al.

(10) Patent No.: US 9,911,615 B2
(45) Date of Patent: Mar. 6, 2018

(54) APPARATUS AND METHOD FOR ETCHING SUBSTRATE, STAMP FOR ETCHING SUBSTRATE AND METHOD FOR MANUFACTURING THE SAME

(71) Applicant: Industry-Academic Cooperation Foundation, Yonsei University, Seoul (KR)

(72) Inventors: Jungwoo Oh, Incheon (KR); Bugeun Ki, Incheon (KR); Yunwon Song, Incheon (KR); Keorock Choi, Incheon (KR); Kyung Ho Kim, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 14/800,456

(22) Filed: Jul. 15, 2015

(65) Prior Publication Data

US 2016/0020112 A1 Jan. 21, 2016

(30) Foreign Application Priority Data

Jul. 18, 2014 (KR) .................. 10-2014-0091222

(51) Int. Cl.
*H01L 21/306* (2006.01)
*H01L 21/67* (2006.01)
(Continued)

(52) U.S. Cl.
CPC .. *H01L 21/30604* (2013.01); *H01L 21/67069* (2013.01); *H01L 21/67092* (2013.01);
(Continued)

(58) Field of Classification Search
CPC ......... H01L 21/30604; H01L 21/67069; H01L 23/42; H01L 21/44; H01L 21/50; H01L 21/52; B01J 35/02
See application file for complete search history.

(56) References Cited

U.S. PATENT DOCUMENTS 5,925,259 A * 7/1999 Biebuyck ................. B41K 1/00
216/10
6,355,198 B1 * 3/2002 Kim ................. A61K 47/48992
264/259
(Continued)

FOREIGN PATENT DOCUMENTS

JP 2013-131674 7/2013
KR 10-0762004 9/2007
(Continued)

OTHER PUBLICATIONS

Translatin of Notice of Grounds for Rejection for KR App No. 10-2014-0091222 dated Nov. 24, 2015, 7 pgs.
(Continued)

*Primary Examiner* — Duy Vu N Deo
(74) *Attorney, Agent, or Firm* — Procopio, Cory, Hargreaves & Savitch LLP

(57) ABSTRACT

The inventive concepts relate to an apparatus and a method for etching a substrate, a stamp for etching a substrate, and a method for manufacturing the stamp. The method for etching a substrate includes bringing a substrate into contact with a stamp including a pattern on which a metal catalyst is formed, and etching the substrate by a chemical reaction between the metal catalyst and an etching solution.

6 Claims, 7 Drawing Sheets

(51) Int. Cl.
　　　*B01J 23/50*　　　(2006.01)
　　　*B01J 23/52*　　　(2006.01)
　　　*B01J 23/42*　　　(2006.01)
　　　*B01J 23/44*　　　(2006.01)

(52) U.S. Cl.
　　　CPC ............... *B01J 23/42* (2013.01); *B01J 23/44* (2013.01); *B01J 23/50* (2013.01); *B01J 23/52* (2013.01)

(56) References Cited

U.S. PATENT DOCUMENTS

| | | | | |
|---|---|---|---|---|
| 6,623,803 | B1* | 9/2003 | Krivokapic | B82Y 30/00 216/13 |
| 2010/0248449 | A1* | 9/2010 | Hildreth | B81C 1/00071 438/460 |

FOREIGN PATENT DOCUMENTS

| | | |
|---|---|---|
| KR | 10-2009-0001075 | 1/2009 |
| KR | 2010-0000234 | 1/2010 |
| KR | 10-2011-0136340 | 12/2011 |

OTHER PUBLICATIONS

Office Action for KR App No. 10-2014-0091222 dated Nov. 24, 2015, 5 pgs.
Song, Y., et al., In-Plane and Out-of-Plane Mass Transport During Metal-Assisted Chemical Etching of GaAs, J Mater. Chem. A, 2014,2, pp. 11017-11021.

* cited by examiner

APPARATUS AND METHOD FOR ETCHING SUBSTRATE, STAMP FOR ETCHING SUBSTRATE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2014-0091222, filed on Jul. 18, 2014, in the Korean Intellectual Property Office, the disclosure of which is hereby incorporated by reference in its entirety.

BACKGROUND

The inventive concepts relate to an apparatus and a method for etching a substrate, a stamp for etching a substrate, and a method for manufacturing the same.

Generally, a process for etching a substrate may be performed by complex processes such as a process for coating a photoresist on a substrate, a lithography process for forming a pattern on the substrate, a development process, an etching process and a process for removing the photoresist. These complex processes may reduce the production rate of the substrate and may increase a manufacture cost of the substrate. A metal-assisted chemical etching process of conventional substrate-etching processes may etch a substrate using a metal catalyst. In the metal-assisted chemical etching process, a metal catalyst pattern may be formed directly on a substrate to be etched by a deposition method, and then, the substrate may be immersed in an etching solution to cause an oxidation-reduction reaction, thereby etching the substrate. In other words, if a metal catalyst layer is formed on a portion, to be etched, of the substrate and then the substrate is immersed in the etching solution, the oxidation-reduction reaction may be caused at an interface between the metal and the substrate. Thus, the metal may burrow into the substrate to etch the substrate.

This metal-assisted chemical etching technique may show an isotropic etching characteristic and may not cause crystal damage and plasma damage on a surface of a semiconductor in etching, and thus, it is possible to minimize surface defects of the semiconductor, which may be caused by an etching process. However, in the metal-assisted chemical etching process, the metal catalyst may not be adhered to a surface of the substrate to be etched but may be partially separated from the substrate, or adhesive strength between the substrate and the metal catalyst may be partially weak. In this case, a corresponding portion of the substrate may not be etched or may be insufficiently etched, so uniformity of the etching process may be deteriorated. In addition, a conventional metal-assisted chemical etching process may require an additional process for removing a chemical etching solution remaining on an etched portion of a substrate after etching the substrate.

SUMMARY

Embodiments of the inventive concepts may provide an apparatus and a method for etching a substrate, a stamp for etching a substrate, and a method for manufacturing the same, which are capable of etching a substrate by a simple method without complex processes such as a photoresist-coating process and a lithography process.

Embodiments of the inventive concepts may also provide an apparatus and a method for etching a substrate, a stamp for etching a substrate, and a method for manufacturing the same, which are capable of improving uniformity of an etching process and a production rate of a substrate and of reducing a manufacture cost of a substrate.

Embodiments of the inventive concepts may also provide an apparatus and a method for etching a substrate, a stamp for etching a substrate, and a method for manufacturing the same, which do not require a process for removing a metal catalyst after a metal-assisted chemical etching process.

In one aspect, a method for etching a substrate may include bringing a substrate into contact with a stamp including a pattern on which a metal catalyst is formed, and etching the substrate by a chemical reaction between the metal catalyst and an etching solution.

In an embodiment, the stamp may be formed of a material that is not etched by the etching solution.

In an embodiment, the substrate may be etched in a state where pressure is applied to the stamp with respect to the substrate.

In an embodiment, the metal catalyst may include at least one of gold, silver, platinum, or palladium.

In an embodiment, plural substrates may be sequentially etched using the stamp.

In an embodiment, the substrate may be a single-element semiconductor substrate formed of silicon or germanium, or a multi-element semiconductor substrate formed of GaAs, AlGaAs or InAlGaAs.

In another aspect, a stamp for etching a substrate may include a pattern for etching a substrate. A metal catalyst may be formed on the pattern.

In still another aspect, an apparatus for etching a substrate may include a stamp including a pattern for etching a substrate, a metal catalyst formed on the pattern, and a pressure device applying pressure to at least one of the substrate and the stamp to bring the metal catalyst into contact with the substrate.

In an embodiment, the pressure device may include a first support plate supporting the stamp, a second support plate supporting the substrate, and a pressure part applying pressure to at least one of the first and second support plates to pressure the stamp with respect to the substrate.

In an embodiment, the apparatus may further include an etching solution storage part storing an etching solution in which the substrate is immersed.

In yet another aspect, a method for manufacturing a stamp for etching an etch target substrate may include forming a pattern for etching the etch target substrate on a substrate for the stamp, and forming a metal catalyst on the pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
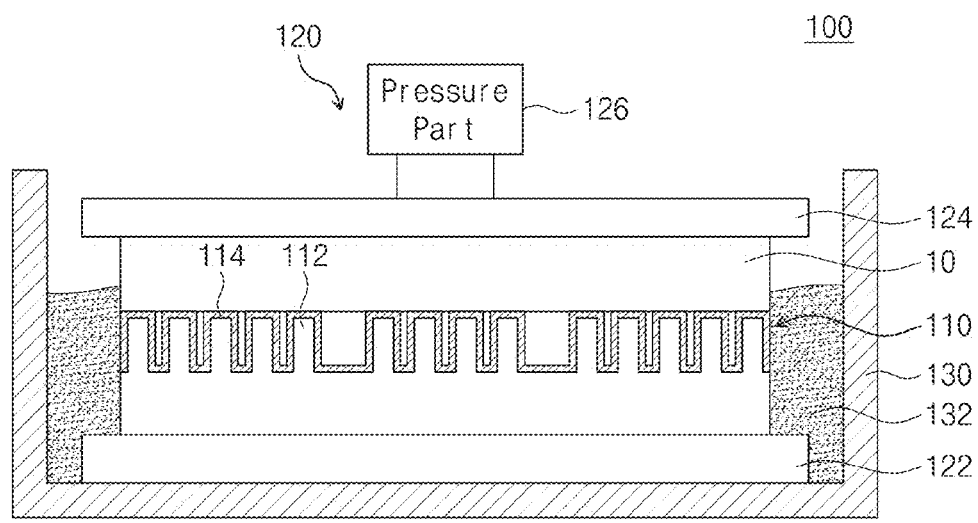
FIG. 1 is a cross-sectional view schematically showing an apparatus for etching a substrate according to an embodiment of the inventive concepts.

The advantages and features of the inventive concepts and methods of achieving them will be apparent from the following embodiments that will be described in more detail with reference to the accompanying drawings. It should be noted, however, that the inventive concepts are not limited to the following exemplary embodiments, and the inventive concepts are defined by scopes of claims. Unless otherwise defined, all terms (including technical and scientific terms) used herein have the same meaning as commonly understood by one of ordinary skill in the art to which example embodiments of inventive concepts belong. General descriptions to a known element may be omitted to clarify the features of the inventive concepts. The same reference numerals or the same reference designators denote the same elements throughout the specification.

In a method for etching a substrate according to an embodiment of the inventive concepts, a stamp having a pattern on which a metal catalyst is formed may come in contact with a substrate, and the substrate may be etched by a chemical reaction between the metal catalyst and an etching solution. According to an embodiment of the inventive concepts, the substrate may be etched without complex processes such as a process for coating a photoresist and a lithography process, and a contact state between the meal catalyst and the substrate may be maintained to improve uniformity of etching.

FIG. 1 is a cross-sectional view schematically showing an apparatus for etching a substrate according to an embodiment of the inventive concepts. Referring to FIG. 1, an apparatus 100 for etching a substrate according to an embodiment of the inventive concepts may include a stamp 110, a pressure device 120, and an etching solution storage part 130.

Figure 2:
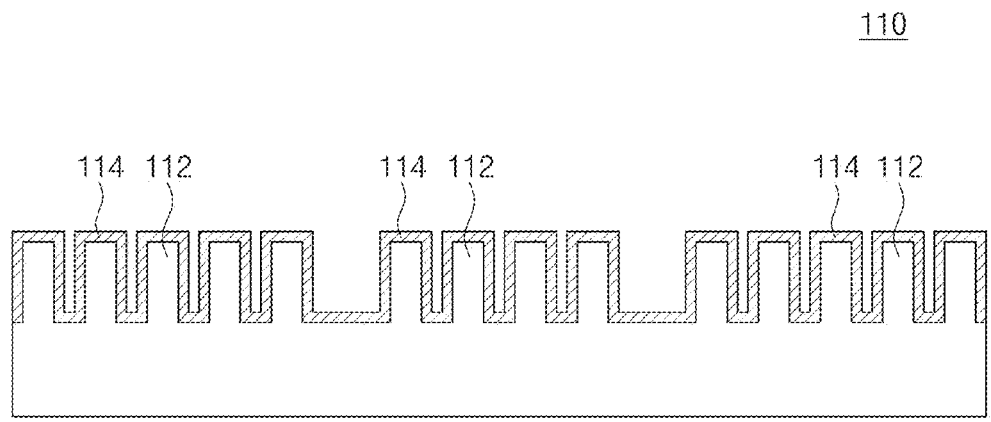
FIG. 2 is a cross-sectional view showing a stamp according to an embodiment of the inventive concepts.

FIG. 2 is a cross-sectional view showing a stamp according to an embodiment of the inventive concepts. Referring to FIGS. 1 and 2, the stamp 110 may be a stamp for etching an etch target substrate 10 corresponding to an object to be etched. The stamp 110 may include a pattern 112 for etching the substrate 10, and a metal catalyst 114 may be formed on the pattern 112. The pattern 112 of the stamp 110 may have a concavo-convex shape or may have one of other various shapes.

The stamp 110 may be formed of a material that is not etched by an etching solution 132 used for etching the substrate 10. For example, the stamp 110 may be formed of at least one of silicon nitride (SiN) and chromium (Cr). A portion of the stamp 110, which is in contact with the metal catalyst 114, may be formed of a material that is not etched by a chemical reaction between the metal catalyst 114 and the etching solution 132. Another portion of the stamp 110, which is not in contact with the metal catalyst 114, may be allowed to be formed of a material (e.g., silicon (Si)) that is etched by the chemical reaction between the metal catalyst 114 and the etching solution.

The metal catalyst 114 may be formed of at least one of noble metals such as gold (Au), silver (Ag), platinum (Pt) and palladium (Pd) or may be formed of another material capable of etching the substrate 10 by a metal-assisted chemical etching process. The metal catalyst 114 may be formed on an entire surface of the pattern 112 or may be formed only on top surfaces of the pattern 112, which are in contact with the substrate 10.

The etch target substrate 10 may be a single-element semiconductor substrate formed of silicon or germanium, a multi-element semiconductor substrate formed of GaAs, AlGaAs, or InAlGaAs, or a glass substrate. However, the inventive concepts are not limited thereto. In some embodiments, the substrate 10 may be a bulk substrate, or a silicon-on-insulator (SOI) substrate partially or fully doped with N-type or P-type dopants.

The pressure device 120 may apply pressure to the stamp 110 with respect to the substrate 10. In some embodiments, the pressure device 120 may include a first support plate 122, a second support plate 124, and a pressure part 126. The first support plate 122 may support the stamp 110. The second support plate 124 may support the substrate 10. The pressure part 126 may apply pressure to at least one of the first and second support plates 122 and 124 to pressure the stamp 110 with respect to the substrate 10.

In the embodiment of FIG. 1, the pressure part 126 applies pressing force to the second support plate 124 to bring the metal catalyst 114 of the stamp 110 into contact with the substrate 10. Alternatively, the pressure part 126 may apply pressure to the first support plate 122 supporting the stamp 110 or may apply pressure to the first and second support plates 122 and 124 at the same time, thereby bringing the metal catalyst 114 of the stamp 110 into contact with the substrate 10.

The pressure part 126 may be a device that is driven by an oil hydraulic cylinder or a motor to apply the pressure or may be a weight body that brings the stamp 110 into contact with the substrate 10 by self-weight. In another embodiment, the first support plate 122 or the second support plate 124 may be formed as a weight body to bring the stamp 110 into contact with the substrate 10.

In an embodiment, the pressure device 120 may control or reduce a distance between the first and second support plates 122 and 124 according to an etching progress degree of the substrate 10, thereby maintaining a proper pressure between the substrate 10 and the stamp 110 which are in contact with each other during the etching process. Since the substrate 10 is etched while applying pressure to the stamp 110 with respect to the substrate 10, the substrate 10 may be etched such that a desired shape of the pattern 112 is transferred to an entire surface of the substrate 10.

The etching solution storage part 130 may store the etching solution 132 in which the etch target substrate 10 is immersed. The etching solution 132 may chemically react with the metal catalyst 114 at the surface of the substrate 10 to be etched, thereby etching the substrate 10 along the pattern 112 of the stamp 110.

In some embodiments, the etching solution 132 may be a solution obtained by mixing an oxidizing agent, an acid, and deionized water (DI water). For example, the etching solution 132 may be a solution obtained by mixing hydrofluoric acid (HF), hydrogen peroxide ($H_2O_2$) and water ($H_2O$), or a solution obtained by mixing sulfuric acid ($H_2SO_4$), potassium permanganate ($KMnO_4$) and water ($H_2O$). However, the inventive concepts are not limited thereto. The metal-assisted chemical etching process may be performed at a temperature of, for example, 40 degrees Celsius to 60 degrees Celsius. However, the inventive concepts are not limited thereto. The metal-assisted chemical etching process may be performed in other temperature ranges.

Figure 3:
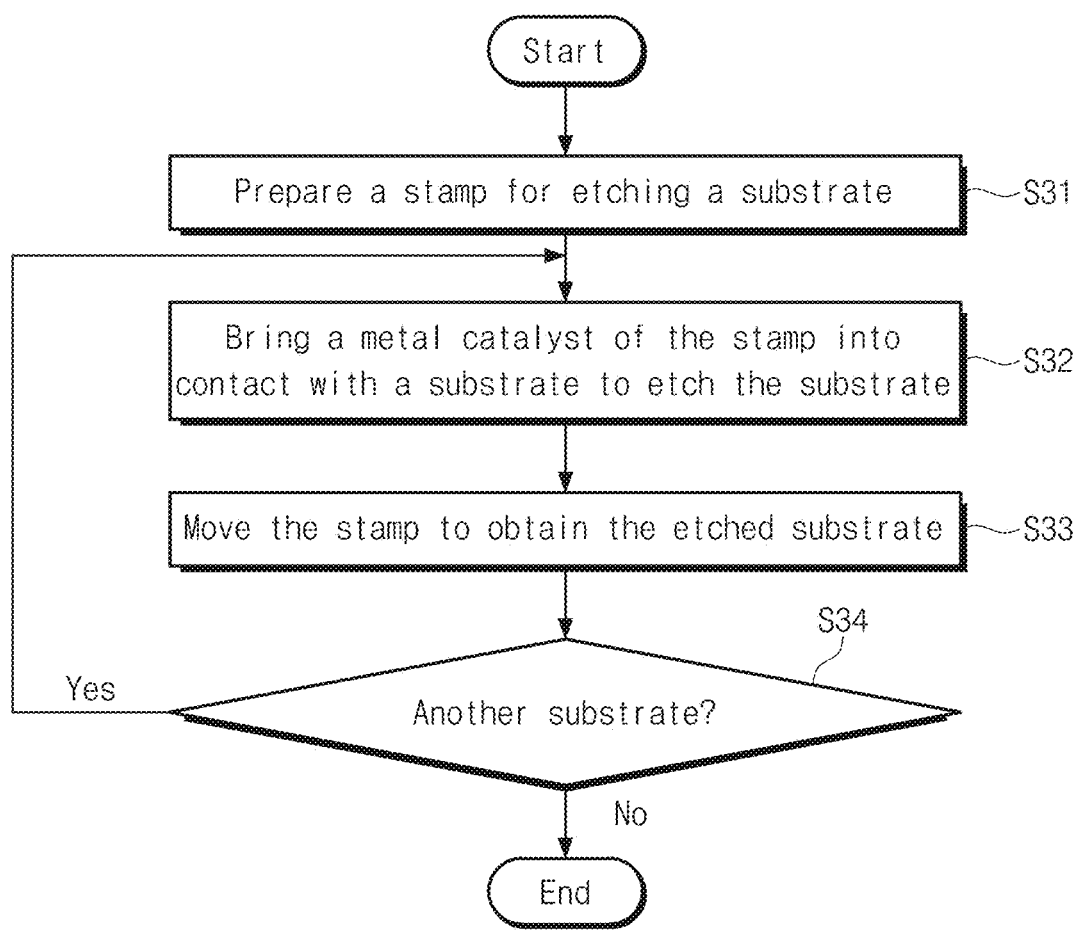
FIG. 3 is a flow chart showing a method for etching a substrate according to an embodiment of the inventive concepts.
Figure 4:
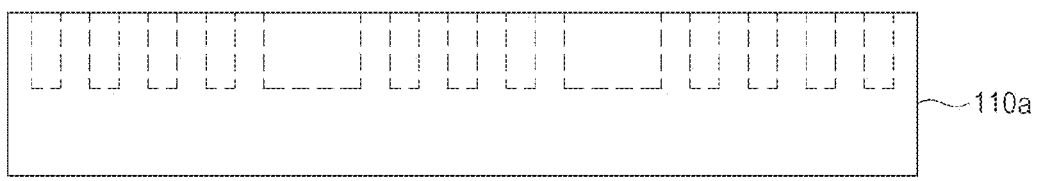
FIGS. 4 and 5 are cross-sectional views showing a method for manufacturing a stamp according to an embodiment of the inventive concepts.
Figure 5:
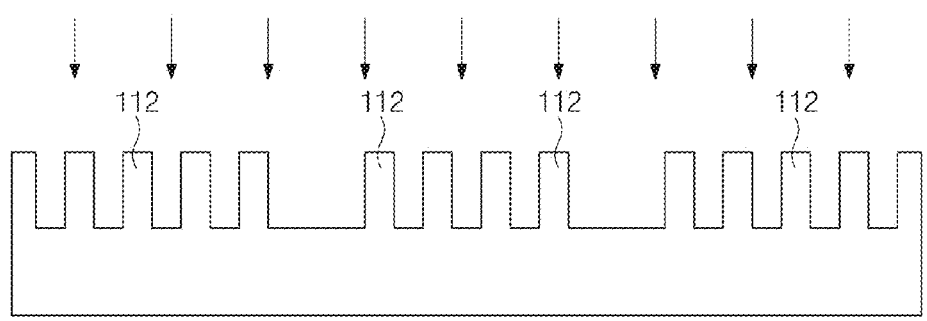

FIG. 3 is a flow chart showing a method for etching a substrate according to an embodiment of the inventive concepts. Referring to FIGS. 1, 2, and 3, first, the stamp for etching a substrate may be prepared (S31). FIGS. 4 and 5 are cross-sectional views showing a method for manufacturing a stamp according to an embodiment of the inventive concepts. Referring to FIGS. 2 and 4, to manufacture the stamp 110, a substrate 110a for the stamp may be prepared, and then the pattern 112 may be formed on the substrate 110a. The pattern 112 of the substrate 110a may be formed by, for example, a reactive ion etching (RIE) process. Alternatively, the patterns 112 of the substrate 110a may be formed by at least one of other various etching methods.

The substrate 110a may be formed of a material (e.g., SiN or Cr) which is not etched by the etching solution 132 which chemically reacts with the metal catalyst 114 to etch the etch target substrate 10. In the substrate 110a for manufacturing the stamp 110, at least a portion which will come in contact with the metal catalyst 114 may be formed of a material which is not etched by the chemical reaction between the metal catalyst 114 and the etching solution 132. However, another portion of the stamp 110, which is not in contact with the substrate 110a, may be allowed to be formed of a material (e.g., silicon) which is etched by the chemical reaction between the metal catalyst 114 and the etching solution 132.

When the pattern 112 is formed on the substrate 110a for the stamp as shown in FIG. 5, the metal catalyst 114 may be formed on the pattern 112 to manufacture the stamp 110 shown in FIG. 2. The metal catalyst 114 may be formed on the pattern 112 by at least one of various methods such as a physical vapor deposition (PVD) method and a chemical vapor deposition (CVD) method.

Referring again to FIGS. 1 to 3, the etch target substrate 10 may be etched by the chemical reaction between the metal catalyst 114 and the etching solution 132 in a state where the metal catalyst 114 of the stamp 110 is in contact with the etch target substrate 10 (S32). At this time, to effectively etch the substrate 10, the substrate 10 may be etched while controlling a distance between the substrate 10 and stamp 110 as the etching process of the substrate 10 progresses.

Figure 6:
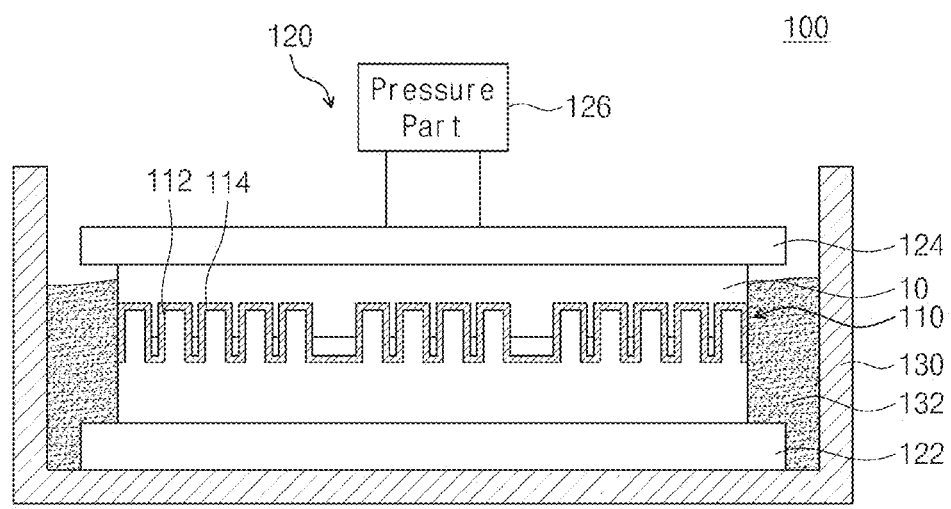
FIG. 6 is a cross-sectional view showing a state of a substrate etched by the method for etching a substrate according to an embodiment of the inventive concepts.

FIG. 6 is a cross-sectional view showing a state of a substrate etched by the method for etching a substrate according to an embodiment of the inventive concepts. The substrate 10 may be immersed in the etching solution 132 to bring the metal catalyst 114 of the stamp 110 into contact with the substrate, and then the pressure device 120 may apply pressure to the substrate 10. Thus, the metal catalyst 114 may burrow into the substrate 10 from a surface of the substrate 10 by the metal-assisted chemical etching, thereby etching the substrate 10 in the shape of the pattern 112 of the stamp 110, as shown in FIG. 6.

Figure 7:
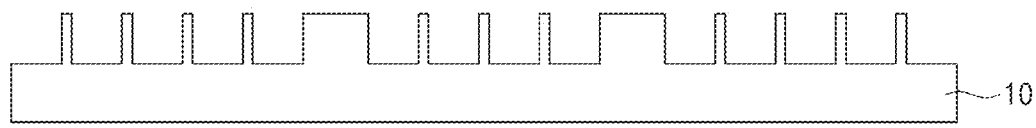
FIG. 7 is a cross-sectional view showing a substrate etched by the method for etching a substrate according to an embodiment of the inventive concepts.

FIG. 7 is a cross-sectional view showing a substrate etched by the method for etching a substrate according to an embodiment of the inventive concepts. Referring to FIGS. 1 to 3 and 7, if the etching of the substrate 10 is completed, the stamp 110 may be moved far away from the substrate 10 to obtain the substrate 10 etched as shown in FIG. 7 (S33). If another substrate to be etched exists, the substrate may be replaced with another substrate, and then the etching process may be performed again on another substrate using the stamp 110 (S34).

In a conventional art, complex processes such as a photoresist-coating process, a lithography process, a development process, an etching process and a photoresist-removing process should be performed to manufacture each semiconductor substrate. However, according to an embodiment of the inventive concepts, the above complex processes of the conventional art can be omitted, and the substrate 10 may be etched by the simple process that includes bringing the metal catalyst stamp into contact with the substrate and immersing the substrate and stamp in the etching solution.

In addition, a conventional metal-assisted chemical etching method may require an additional process for removing a metal catalyst remaining on an etched portion after etching a substrate using the metal catalyst. However, according to an embodiment of the inventive concepts, the metal catalyst may be easily removed from the substrate by lifting the stamp from the etched substrate. Thus, the metal-assisted chemical etching process according to the inventive concepts may not require an additional process for removing a metal catalyst.

Moreover, according to an embodiment of the inventive concepts, a plurality of substrates may be sequentially etched using one stamp. In other word, the stamp may be separated from the substrate after etching the substrate, and then the etching process may be repeatedly performed on other substrates by means of the stamp. As a result, a process time of the etching process may be markedly reduced, so a production rate of the substrate may be improved and a manufacture cost of the substrate may be reduced.

Furthermore, in a conventional metal-assisted chemical etching process, a metal catalyst deposited on a substrate may not be sufficiently adhered to a surface of the substrate, so a corresponding portion of the substrate may be insufficiently etched to deteriorate uniformity of an etching process. However, according to an embodiment of the inventive concepts, the pressure may be applied to bring the stamp into contact with the substrate, and thus, an etch rate may be substantially uniform throughout an entire surface of the substrate. In other word, uniformity of etching may be improved.

Furthermore, according to an embodiment of the inventive concepts, the distance between the substrate and the stamp may be controlled or the pressure between the substrate and the stamp may be uniformly maintained during the etching process, so the contact state between the substrate and the metal catalyst of the pattern may be maintained. The metal catalyst may be in contact with the substrate by a proper pressure, so uniform etching may be performed on the entire surface of the substrate regardless of an etching progress degree. In a conventional metal-assisted chemical etching process, an etch depth may be easily varied according to a position in a substrate. However, according to an embodiment of the inventive concepts, a relatively deep region of the substrate may not come in contact with the metal catalyst of the stamp when a relatively shallow region of the substrate is in contact with the metal catalyst of the stamp, so the relatively deep region may not be etched until the relatively shallow region is etched to a depth of the relatively deep region. As a result, etch depths of the substrate may be uniform.

Figure 8:
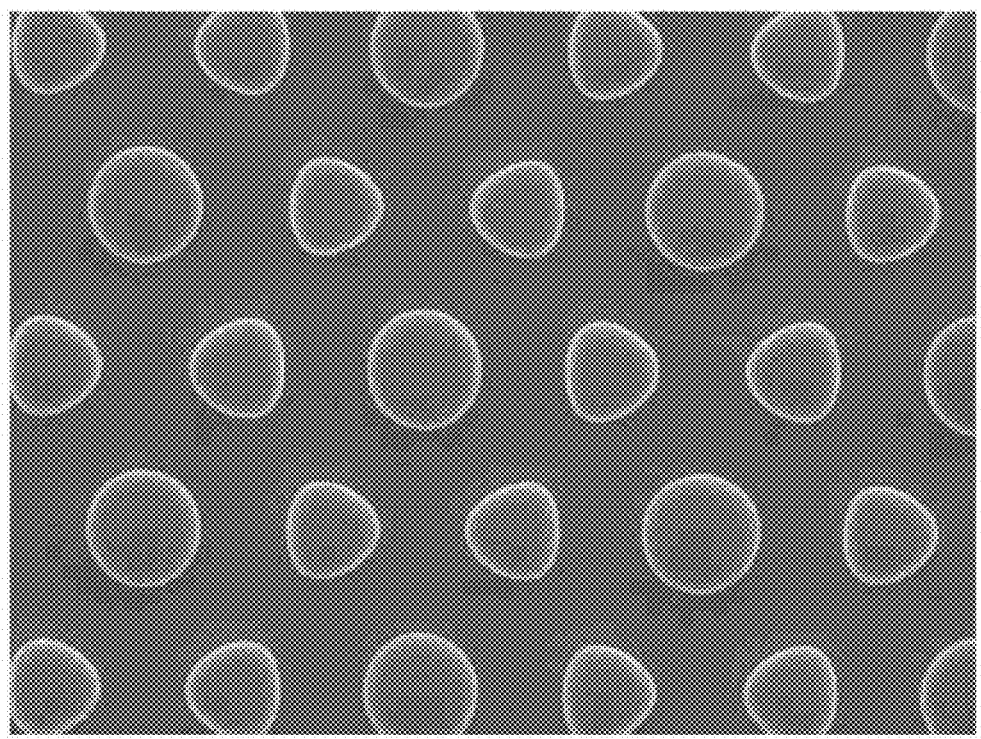
FIG. 8 is an image showing a stamp for etching a substrate according to an embodiment of the inventive concepts.
Figure 9:
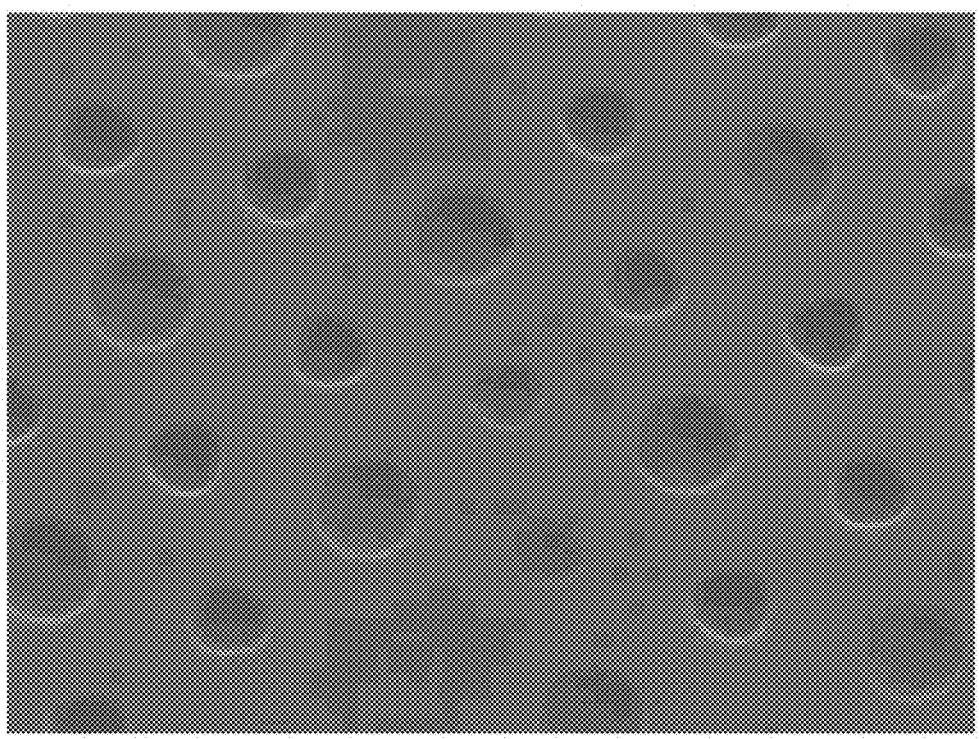
FIG. 9 is an image showing a substrate etched using the stamp of FIG. 8 according to an embodiment of the inventive concepts.
Figure 10:
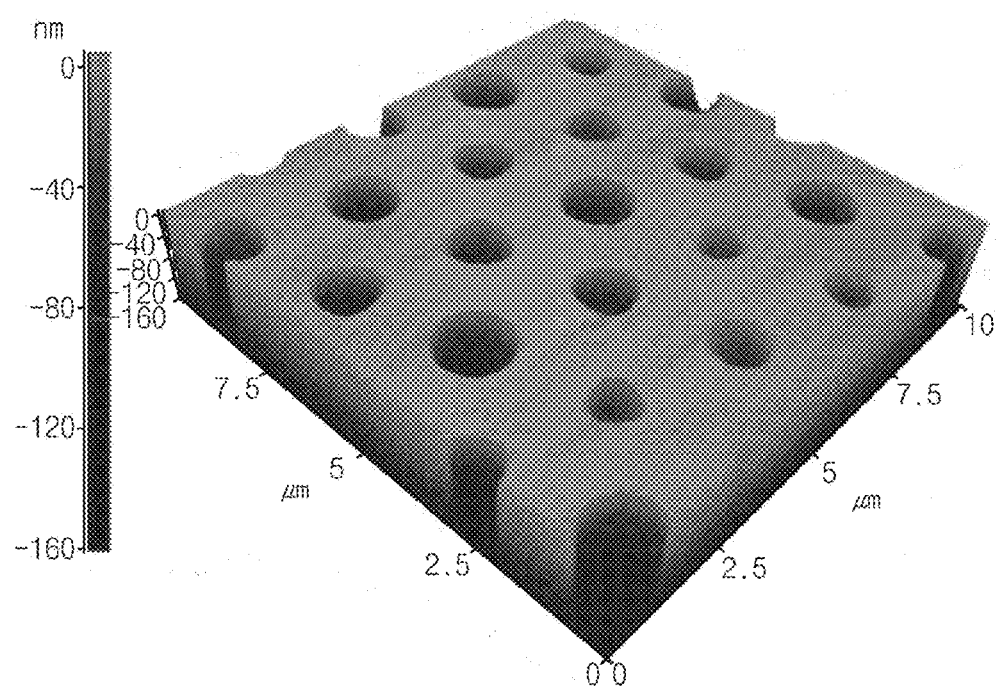
FIG. 10 is an atomic force microscopy image showing the substrate etched using the stamp of FIG. 8 according to an embodiment of the inventive concepts.

FIG. 8 is an image showing a stamp for etching a substrate according to an embodiment of the inventive concepts, FIG. 9 is an image showing a substrate etched using the stamp of FIG. 8 according to an embodiment of the inventive concepts, and FIG. 10 is an atomic force microscopy image showing the substrate etched using the stamp of FIG. 8 according to an embodiment of the inventive concepts. A silicon substrate was etched using the stamp having the pattern on which a gold catalyst was formed, according to an embodiment of the inventive concepts. The etching solution obtained by mixing hydrofluoric acid (HF), hydrogen peroxide ($H_2O_2$) and water ($H_2O$) was used when the silicon substrate was etched.

As shown in FIGS. 9 and 10, the substrate was etched by the method for etching a substrate according to an embodiment of the inventive concepts, so concave patterns having sizes of several micrometers or less and uniform depths were formed in the substrate. The method for etching a substrate according to an embodiment of the inventive concepts may be widely applied to various fields such as an etching process for isolation required to form a ohmic contact and an etching process for manufacturing a fin field effect transistor (FinFET) corresponding to a three-dimensional semiconductor device.

According to an embodiment of the inventive concepts, the substrate may be etched by the simple process without complex processes including the lithography process.

In addition, according to an embodiment of the inventive concepts, the uniformity of etching of the substrate may be improved.

Moreover, according to an embodiment of the inventive concepts, the production rate of the substrate may be improved and the manufacture cost of the substrate may be reduced.

Furthermore, the method for etching a substrate according to the inventive concepts may not require an additional process of removing the metal catalyst from the substrate after the metal-assisted chemical etching process.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for etching a substrate, the method comprising:
    bringing a stamp into contact with a substrate, the stamp comprising a pattern on which a metal catalyst is formed; and
    immersing the substrate and the stamp in an etching solution causing an oxidation-reduction reaction with the metal catalyst, to etch the substrate by a chemical reaction of a metal-assisted chemical etching between the metal catalyst and the etching solution,
    wherein the substrate is etched in a state where pressure is applied to the stamp with respect to the substrate, by the oxidation-reduction reaction of the metal-assisted chemical etching between the metal catalyst and the etching solution,
    wherein the substrate is etched while controlling a distance between the substrate and the stamp, and
    wherein the metal catalyst is formed on an entire surface of the pattern including top and side surfaces of the pattern, the metal catalyst surrounding the pattern.

2. The method of claim 1, wherein the stamp is formed of a material that is not etched by the etching solution.

3. The method of claim 1, wherein the metal catalyst comprises at least one selected from gold, silver, platinum, and palladium.

4. The method of claim 1, wherein plural substrates are sequentially etched using the stamp.

5. The method of claim 1, wherein the substrate is a single-element semiconductor substrate formed of silicon or germanium, or a multi-element semiconductor substrate formed of GaAs, AlGaAs or InAlGaAs.

6. The method of claim 1, wherein the substrate is etched at a temperature greater than or equal to 40° C. and less than or equal to 60° C.

* * * * *